US010615955B2

(12) United States Patent
Oh et al.

(10) Patent No.: US 10,615,955 B2
(45) Date of Patent: *Apr. 7, 2020

(54) MULTI-RATE TRANSCEIVER CIRCUITRY

(71) Applicant: Altera Corporation, San Jose, CA (US)

(72) Inventors: Boon Hong Oh, Bukit Mertajam (MY); Chee Seng Tan, Bayan Lepas (MY); Chau Perng Chin, Kepong (MY)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/154,513

(22) Filed: Oct. 8, 2018

(65) Prior Publication Data

US 2019/0097784 A1    Mar. 28, 2019

Related U.S. Application Data

(63) Continuation of application No. 15/415,751, filed on Jan. 25, 2017, now Pat. No. 10,129,013, which is a continuation of application No. 14/605,871, filed on Jan. 26, 2015, now Pat. No. 9,559,834.

(51) Int. Cl.
*H04L 7/00* (2006.01)
*H03L 7/00* (2006.01)
*H04L 7/033* (2006.01)

(52) U.S. Cl.
CPC .............. *H04L 7/0087* (2013.01); *H03L 7/00* (2013.01); *H04L 7/0091* (2013.01); *H04L 7/0331* (2013.01)

(58) Field of Classification Search
CPC ... H04L 7/0087; H04L 7/0091; H04L 7/0331; H03L 7/08; H03L 7/00
See application file for complete search history.

(56) References Cited

U.S. PATENT DOCUMENTS

| 6,091,765 | A  | 7/2000 | Pietzold, III et al. |
| 6,839,394 | B1 | 1/2005 | Duffy |
| 7,035,228 | B2 | 4/2006 | Baumer |
| 7,200,336 | B2 | 4/2007 | Yu et al. |
| 7,567,758 | B2 | 7/2009 | Aronson et al. |

(Continued)

FOREIGN PATENT DOCUMENTS

WO      2014094266 A1    6/2014

*Primary Examiner* — Syed Haider
(74) *Attorney, Agent, or Firm* — Fletcher Yoder, P.C.

(57) ABSTRACT

Techniques to operate circuitry in an integrated circuit are provided. The circuitry may include rate detection circuitry, receiver circuitry, and configuration circuitry. The receiver circuitry may receive a data stream with an arbitrary data rate. The rate detection circuitry may receive a reference clock signal that is associated with the received data stream. The rate detection circuitry determines the frequency of the reference clock signal such that an appropriate clock signal may be generated for the receiver circuitry. The receiver clock signal may be generated by clock generation circuitry that is coupled to the rate detection circuitry. The configuration circuitry may accordingly configure the receiver circuitry based at least on the determined frequency of the reference clock signal so that the receiver circuitry may operate at the arbitrary data rate.

20 Claims, 5 Drawing Sheets

(56) References Cited

U.S. PATENT DOCUMENTS

| | | | |
|---|---|---|---|
| 7,598,768 B1* | 10/2009 | Tetzlaff | G05B 19/054 |
| | | | 326/38 |
| 7,672,416 B2 | 3/2010 | Hadzic et al. | |
| 8,090,335 B1 | 1/2012 | Bataineh | |
| 2002/0056133 A1 | 5/2002 | Fung et al. | |
| 2002/0097682 A1 | 7/2002 | Enam et al. | |
| 2004/0042539 A1 | 3/2004 | Vishakhadatta et al. | |
| 2004/0151506 A1 | 8/2004 | Shiramizu et al. | |
| 2004/0190667 A1 | 9/2004 | Matsuura | |
| 2006/0251197 A1 | 11/2006 | Zaucha et al. | |
| 2008/0043892 A1* | 2/2008 | Hsiao | H04L 7/0004 |
| | | | 375/376 |
| 2009/0010310 A1 | 1/2009 | Rofougaran et al. | |
| 2009/0251181 A1* | 10/2009 | Bae | G11C 7/22 |
| | | | 327/156 |
| 2010/0020912 A1 | 1/2010 | Lesso | |
| 2011/0012663 A1 | 1/2011 | Crowley et al. | |
| 2011/0075778 A1* | 3/2011 | Chang | G06F 1/08 |
| | | | 375/354 |
| 2011/0217934 A1* | 9/2011 | Oga | H04B 7/01 |
| | | | 455/62 |
| 2011/0311012 A1 | 12/2011 | Chen et al. | |
| 2013/0002954 A1* | 1/2013 | Shin | H04N 21/242 |
| | | | 348/524 |
| 2013/0208839 A1 | 8/2013 | Isberg | |
| 2014/0198703 A1 | 7/2014 | Merlin et al. | |
| 2014/0258768 A1 | 9/2014 | Chang et al. | |
| 2015/0098527 A1* | 4/2015 | Wang | H04L 7/033 |
| | | | 375/316 |
| 2016/0173272 A1 | 6/2016 | Khan et al. | |

* cited by examiner

MULTI-RATE TRANSCEIVER CIRCUITRY

This is a continuation of U.S. patent application Ser. No. 15/415,751, filed Jan. 25, 2017, and entitled "Multi-Rate Transceiver Circuitry", which is a continuation of U.S. patent application Ser. No. 14/605,871, filed Jan. 26, 2015, now U.S. Pat. No. 9,559,834, and entitled "Multi-Rate Transceiver Circuitry", which are hereby incorporated by reference herein in their entirety for all purposes.

BACKGROUND

Integrated circuit devices, such as field programmable gate array (FPGA) devices and application specific integrated circuits (ASICs), may be used to transmit and receive high-speed signals using a contiguous multi-rate communications protocol. There are a variety of applications or input-output interfaces that require a contiguous multi-rate communications protocol. An example of such an interface includes a High Definition Multimedia Interface (HDMI) standard.

Generally, transceiver circuitry is adapted to operate at predetermined or specific data rates. A contiguous multi-rate protocol, such as the HDMI standard, on the other hand, allows any arbitrary clock rate. For example, in the HDMI standard, the pixel clock rate can range from 25 megahertz (MHz) to 600 MHz with associated line rates ranging from 250 megabits per second (Mbps) to 6 gigabits per second (Gbps). The predetermined operating rates of conventional transceiver circuitry typically limit the transceiver's ability to cover the entire operating range of the HDMI standard. Therefore, transceiver circuitry that operates at predetermined data rates can only support those HDMI standards having similar data rates to the transceiver circuitry.

In some instances, transceiver circuitry in an ASIC device leverages a phase-locked loop (PLL) circuit that has a voltage controlled oscillator (VCO) with a wide tuning range to support HDMI interfaces at different data rates (or other input-output standards with arbitrary data rates). This allows the ASIC device to meet the requirements of different HDMI applications. However, such a solution is generally undesirably costly.

As performance requirements increase and higher resolutions are introduced, transceiver circuitry may need to be adapted to support different input-output interfaces with different data rates. It is within this context that the embodiments described herein arise.

SUMMARY

Transceiver circuitry and techniques for supporting data or video streams at different data rates are provided. Embodiments provided herein include transceiver circuitry to be reconfigured to operate at different data rates to support input-output protocols with arbitrary data rates. It is appreciated that the present invention can be implemented in numerous ways, such as a process, an apparatus, a system, or a device. Several inventive embodiments of the present invention are described below.

Generally, an integrated circuit, or more specifically transceiver circuitry on the integrated circuit, may be adapted to receive or transmit data streams at different dates rates. A method of operating an integrated circuit may include receiving a reference clock signal from external circuitry. The reference clock signal may be received at rate detection circuitry on the integrated circuit. The frequency of the received reference clock signal may then be determined by the rate detection circuitry. Clock generation circuitry may generate a receiver clock signal for receiver circuitry on the integrated circuit based on the determined frequency of the reference clock signal. The receiver circuitry may accordingly be configured to operate at the frequency of the reference clock signal.

A method of operating circuitry on an integrated circuit may include receiving a data stream having an associated data rate with a receiver circuit. The circuitry may further receive a reference clock signal associated with the data stream. The frequency of the reference clock signal is determined with clock measuring circuitry. The frequency of the reference clock signal may then be compared with a current operating frequency of the receiver circuit. State machine circuitry may be used to compare the two frequencies to detect if the current frequency needs to be changed. When the frequency of the reference clock signal is different from the current frequency of the receiver circuit, the receiver circuit is configured based on the reference clock signal and the data rate of the data stream to accommodate the change in the current frequency.

Circuitry that supports data streams at different data rates may perform any or all of the steps mentioned above. Such circuitry may include a clock generation circuit, a receiver circuit, rate detection circuitry, and configuration circuitry. The rate detection circuitry may receive a reference clock signal with an associated frequency. The reference clock signal may be received from an external element. The rate detection circuitry detects the frequency of the reference clock signal based on a fixed frequency signal. As an example, the frequency of the reference clock signal may be determined by comparing it with respect to the known frequency of the fixed frequency signal. The configuration circuitry may configure the clock generation circuit and the receiver circuit based on the detected frequency of the reference clock signal. In some instances, the receiver circuit may be adapted or configurable to operate at different frequencies or data rates.

DETAILED DESCRIPTION

The embodiments provided herein include circuitry and techniques that allow receiver circuitry and/or transceiver circuitry in an integrated circuit (IC) to operate at multiple different data rates.

It will be obvious to one skilled in the art that the present exemplary embodiments may be practiced without some or all of these specific details. In other instances, well-known operations have not been described in detail in order not to unnecessarily obscure the present embodiments. Furthermore, the exemplary embodiments below are described in the context of transmitting and receiving video signals, such as those compliant with the HDMI standard, but one of ordinary skill in the art will recognize that these embodiments may also be used to support other contiguous multi-rate protocols, including, but not limited to the JESD204 standard (a Joint Electron Device Engineering Council (JEDEC) standard for aerial data interfacing).

Figure 1:
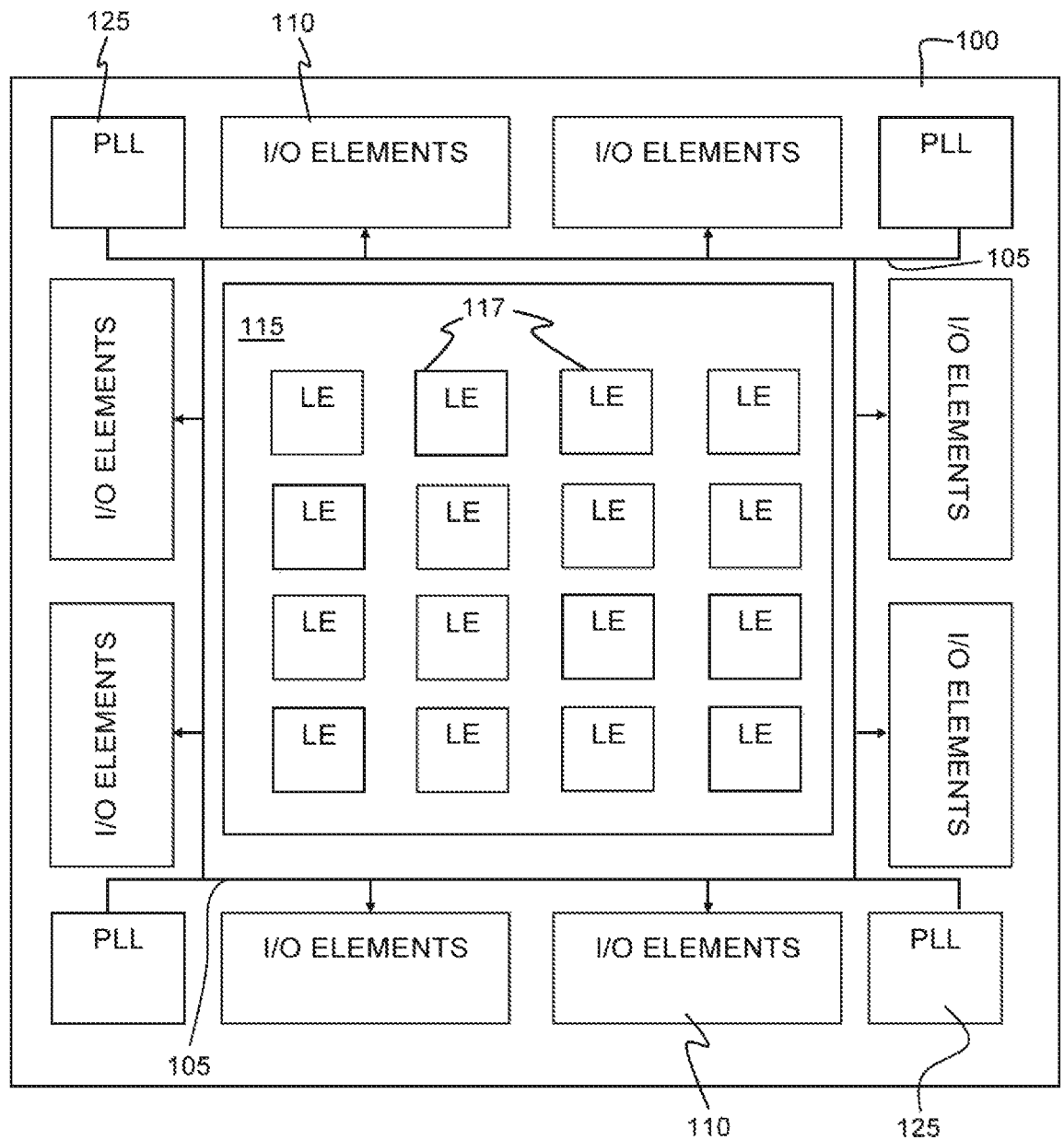
FIG. 1 is a block diagram of an illustrative integrated circuit in accordance with embodiments of the present invention.

An IC device, such as a field-programmable gate array (FPGA) device or an application specific integrated circuit (ASIC) device, generally includes high-speed input-output circuitry, including, among others, transceiver circuitry. FIG. 1, meant to be illustrative and not limiting, shows a block diagram of IC 100 that can implement embodiments of the present invention. Generally, an IC device such as IC 100 includes core logic region 115 and input-output elements 110.

Generally, clock signals are used to synchronize different circuit elements in an IC device. Phase-locked loops (PLLs) 125 for clock generation and timing may be located outside the core logic region 115 (e.g., at corners of IC 100 and adjacent to input-output elements 110 as shown in FIG. 1), As shown in FIG. 1, IC 100 may include clock network 105. It should be appreciated that clock network 105 may be used to transmit clock signals from clock circuits (e.g., PLLs 125) to core logic region 115 and various parts of IC 100.

Core logic region 115 may be populated with logic cells that include "logic elements" (LEs) 117, among other circuits. LEs 117 may include look-up table-based logic regions and may be grouped into "Logic Array Blocks" (LABs). LEs 117 and groups of LEs or LABs can be configured to perform logical functions desired by the user. Configuration data loaded into configuration memory may be used to produce control signals that configure LEs 117 and groups of LEs and LABs to perform the desired logical functions.

Signals received from external circuitry at input-output elements 110 may be routed from input-output elements 110 to core logic region 115 and other logic blocks on IC 100. Core logic region 115 and other logic blocks on IC 100 may accordingly perform functions based on the signals received.

Signals may be sent from core logic region 115 and other relevant logic blocks of IC 100 to other external circuitry or components that may be connected to IC 100 through input-output elements 110. A single device like IC 100 can potentially support a variety of different interfaces and each individual input-output bank 110 can support a different input-output standard with a different interface or protocol (e.g., high-speed serial interface protocol).

In the embodiment of FIG. 1, input-output elements 110 may include input-output buffers and high-speed transceiver circuitry that connect IC 100 to other external components. Generally, transceiver circuitry may include transmitter and receiver circuits that communicate with external components via different interfaces. In one scenario, transceiver circuitry (not shown) in IC 100 may receive and transmit video streams at different resolutions and data rates.

Figure 2:
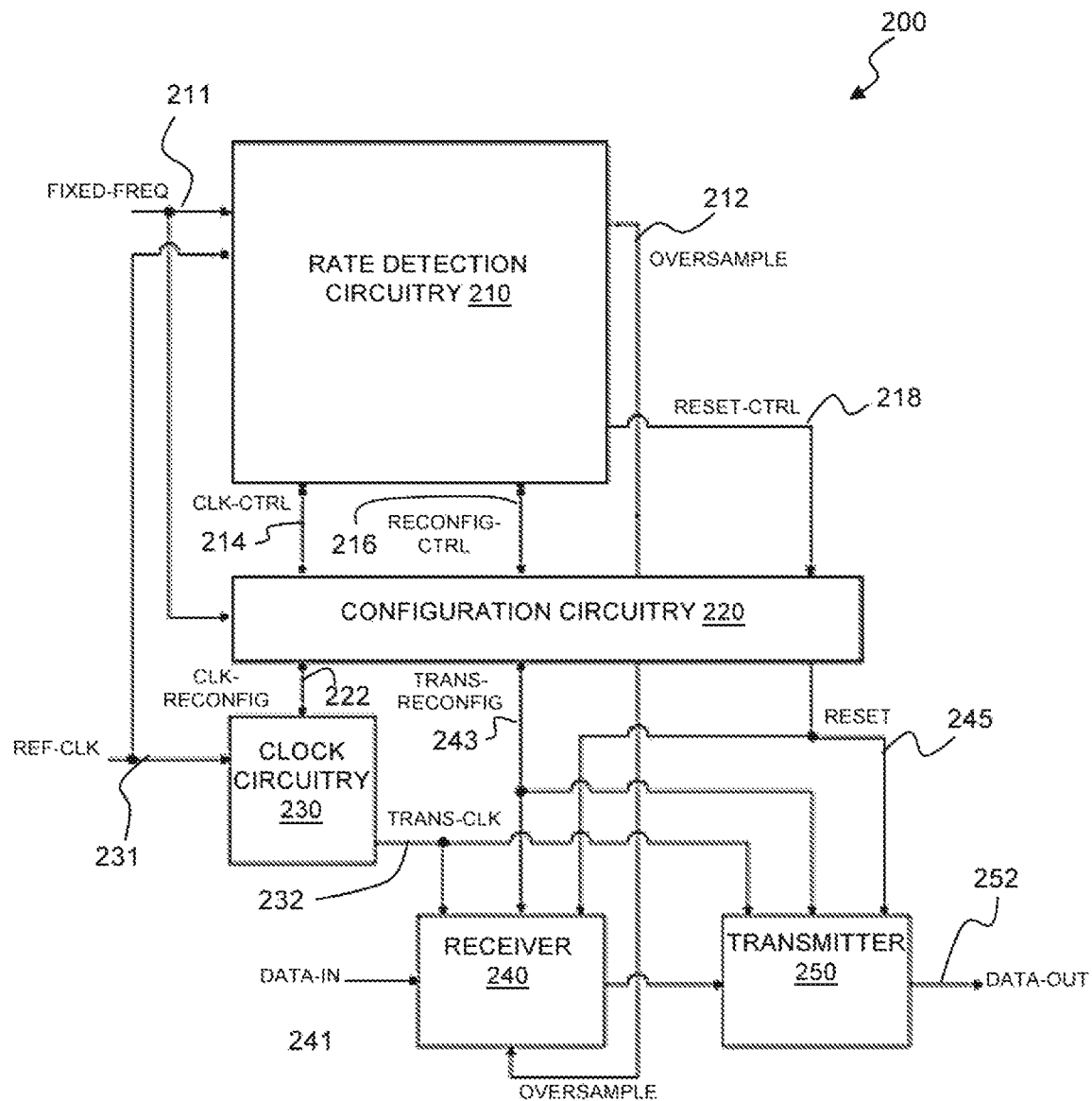
FIG. 2 shows illustrative transceiver circuitry with configurable receiver and transmitter circuits in accordance with embodiments of the present invention.

In order to receive or transmit video streams at different data rates, a device such as IC 100 may include configurable receiver and/or transmitter circuits as well as circuitry that is able to detect changing data rates or clock signals. FIG. 2 shows illustrative transceiver circuitry 200 with configurable receiver and transmitter circuits in accordance with embodiments of the present invention. Transceiver circuitry 200 includes rate detection circuitry 210, configuration circuitry 220, clock generation circuitry 230, receiver circuit 240, and transmitter circuit 250.

When transceiver circuitry 200 receives a signal or data stream having a particular data rate, receiver circuit 240 and transmitter circuit 250 are configured accordingly such that transceiver circuitry 200 may operate at that data rate. Rate detection circuitry 210 may detect any changes in the data rate so that receiver circuit 240 and transmitter circuit 250 may be reconfigured using configuration circuitry 220 based on any detected changes in the data rate.

As an example, when receiver circuit 240 receives a data stream DATA-IN 241 having an arbitrary data rate, configuration circuitry 220 may send appropriate signals (e.g., a transmitter reconfiguration signal TRANS-RECONFIG 243 and a reset signal RESET 245) to receiver circuit 240 to reconfigure receiver circuit 240 (and transmitter circuit 250) based on the reference signal REF-CLK 231 that is associated with the received data stream DATA-IN 241. In one embodiment, clock generation circuitry 230 and rate detection circuitry 210 may receive a clock signal REF-CLK 231 that is associated with the received data stream DATA-IN 241.

In one example, transceiver circuitry 200 may be adapted to receive high-definition multimedia interface (HDMI) signals from external circuitry (not shown) that is coupled to transceiver circuitry 200. It should be noted that relevant protocol circuit blocks (e.g., oversampler circuit, HDMI protocol blocks, etc.) that may be coupled between receiver circuit 240 and transmitter circuit 250 are not shown in FIG. 2 in order to not unnecessarily obscure the present invention. A given HDMI interface may include multiple transition multimedia differential signaling (TMDS) data channels and a single TMDS clock channel. In such a scenario, clock generation circuitry 230 and rate detection circuitry 210 may receive the TMDS clock signal as REF-CLK 231.

Rate detection circuitry 210 may first compare the reference signal REF-CLK 231 with a fixed frequency clock signal FIXED-FREQ 211 to determine the frequency of signal REF-CLK 231. Once the frequency of signal REF-CLK 231 has been determined, clock generation circuitry 231 may generate a corresponding clock signal TRANS-CLK signal 232 for receiver circuit 240 and transmitter circuit 250 based on signal REF-CLK 231. In one embodiment, configuration circuitry 220 may be used to reconfigure clock generation circuitry 230 depending on the frequency of REF-CLK 231 as determined by rate detection circuitry 210. As shown in FIG. 2, rate detection circuitry 210 may output appropriate control signals (e.g., CLK-CTRL 214, RECONFIG-CTRL 216, and RESET-CTRL 218) to configuration circuitry 220 based on the frequency of REF-CLK 231.

Based on the control signals CLK-CTRL 214, and RECONFIG-CTRL 216 received from rate detection circuitry 210, configuration circuitry 220 may accordingly generate appropriate configuration signals CLK-RECONFIG 222, and TRANS-RECONFIG 243 to configure or reconfigure clock generation circuitry 230 and receiver circuit 240 (and optionally transmitter circuit 250), respectively. In one embodiment, a control signal such as RESET-CTRL 218 may be generated by rate detection circuitry 210 to control the configuration of receiver circuit 240 and transmitter circuit 250. For example, once receiver circuit 240 and transmitter circuit 250 has been configured or loaded with the appropriate configuration settings, configuration circuitry 220 may generate RESET signal 245 based on RESET-CTRL 218 to enable receiver circuit 240 and transmitter circuit 250 to be set or configured to the new configuration settings.

When clock generation circuitry 230 is configured (or reconfigured), clock generation circuitry 230 may generate an appropriate clock signal TRANS-CLK 232 for receiver circuit 240 and transmitter circuit 250. Accordingly, reconfiguration signals TRANS-RECONFIG 243 may configure receiver circuit 240 and transmitter circuit 250 to operate at the appropriate frequency or data rate based on the received data stream DATA-IN 241. In some instances, depending on the data rate of the received data stream DATA-IN 241 and the minimum data rate of transceiver circuitry 200, DATA-IN 241 may need to be oversampled.

As shown in FIG. 2, rate detection circuitry 210 may assert a flag signal OVERSAMPLE 212 to indicate when the received data stream DATA-IN 241 needs to be oversampled by receiver circuit 240. Accordingly, transmitter circuit 250 may output a data stream DATA-OUT 252 at the same data rate as data stream DATA-IN 241. It should be noted that rate detection circuitry 210 may be formed by various different circuits and configuration circuitry 220 may include controller and reconfiguration circuit blocks that are not explicitly shown in FIG. 2.

Figure 3:
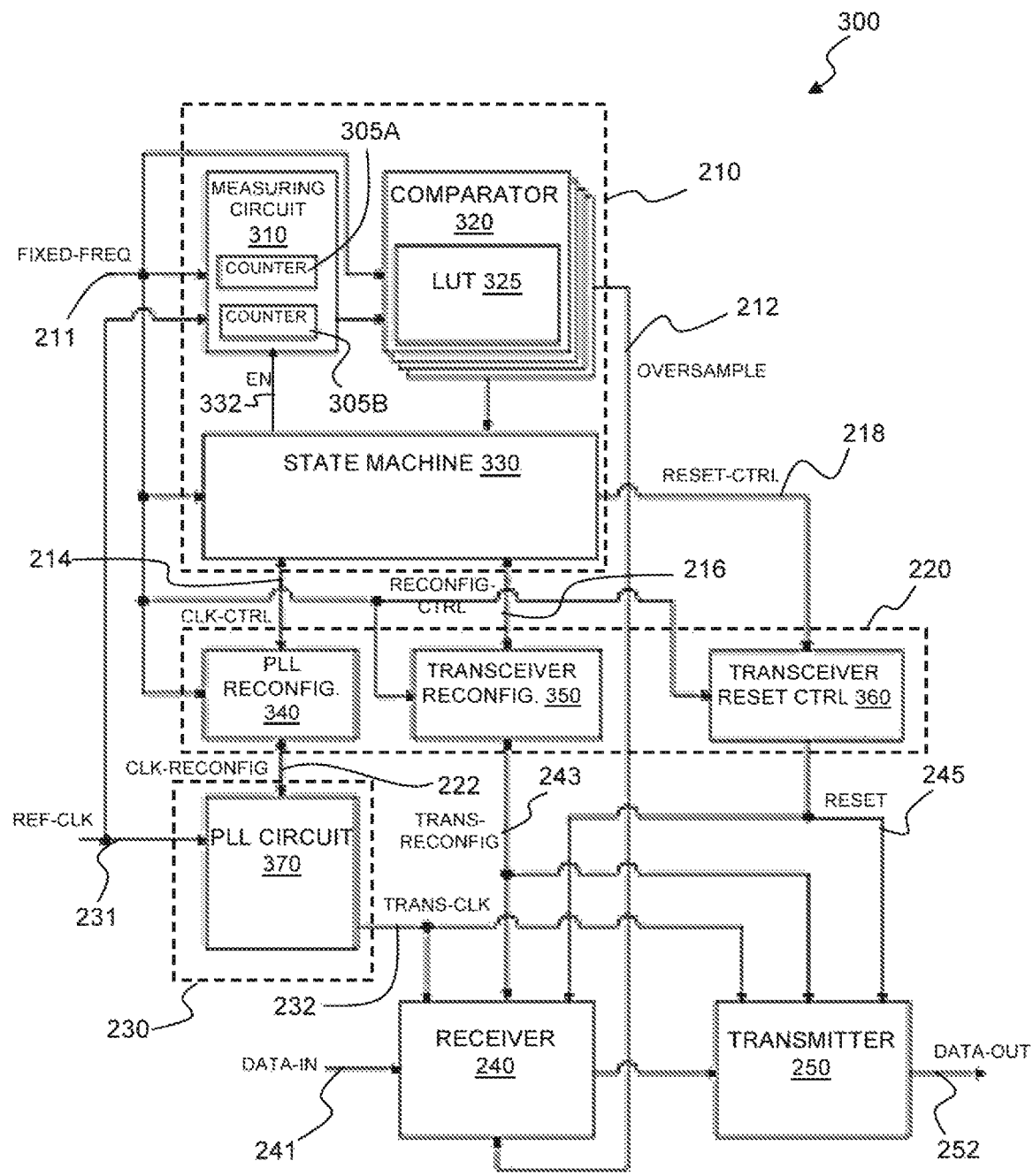
FIG. 3 shows various circuit blocks within rate detection circuitry and configuration circuitry in accordance with embodiments of the present invention.

FIG. 3 is an illustrative diagram showing various circuit blocks within rate detection circuitry 210 and configuration circuitry 220 in accordance with embodiments of the present invention. As shown in FIG. 3, clock measuring circuit 310 may be coupled to comparator circuit 320 and state machine 330. State machine 330 may send an asserted enable signal EN 332 to enable clock measuring circuit 310 such that clock measuring circuit 310 may begin to measure or determine the frequency of a received reference clock signal (e.g., REF-CLK signal 231). When clock measuring circuit 310 is enabled and transceiver circuitry 300 receives REF-CLK signal 231, clock measuring circuit 310 measures REF-CLK signal 231 based on a predetermined signal with a fixed frequency, (e.g., signal FIXED-FREQ 211). In the example of FIG. 3, clock measuring circuit 310 includes two counters 305A and 305B. As an example, counter 305A may run at a fixed frequency (e.g., 100 megahertz (MHz)) whereas counter 305B may run at the reference clock REF-CLK 231 frequency to be measured. This example is merely illustrative and, in general, any desired number of counter circuits may be used.

If desired, a gate signal may be toggled every 100 microseconds and synchronized to enable and disable reference clock counter 305B. In an example where signal REF-CLK 231 is a TMDS clock running at 74.25 MHz, the expected count value may be 7425 at every 100 microseconds. It should be noted that the gate signal may be toggled at different rates and different count values may be generated accordingly. For example, the gate signal may be toggled every 10 milliseconds and the expected count value generated in this example would be 742500 at every 10 milliseconds (assuming the signal REF-CLK 231 is running at 74.25 MHz). In one scenario, a valid signal may be asserted when the count value reaches its last synchronization stage. Once the final count value has been obtained, comparator circuit 320 may compare the final count value with signal FIXED-FREQ 211.

Comparator circuit 320 may determine the frequency range and settings for receiver circuit 240, transmitter circuit 250, and PLL circuit 370 based on the final count value. In some embodiments, there may be multiple comparator circuits 320, each with its own predefined transceiver or PLL settings stored in a corresponding look-up table (LUT) 325.

In one embodiment, a "less-than" comparison may be performed sequentially on the final count value produced by the clock measuring circuit 310. As an example, the final count value may be compared with respect to a predefined count threshold stored in the respective LUTs 325. In one scenario, the respective LUTs 325 may store encoded values for different threshold values or ranges of threshold values. The comparator circuit 320 may also assert OVERSAMPLE flag or signal when oversampling is required.

Based on the frequency range determined from the final count value, the encoded values obtained from the LUTs 325 may be transmitted to state machine 330. In one embodiment, appropriate configuration settings may be determined and transmitted to state machine 330 together with the encoded values. State machine 330 may compare the current operating frequency of transceiver circuitry 300 with the received configuration settings to determine whether a reconfiguration operation is required. In one embodiment, state machine 330 may compare the received encoded values with its current encoded values to determine if clock generation circuitry 230, receiver circuit 240 and transmitter circuit 250 need to be reconfigured.

To reconfigure clock generation circuitry 230, receiver circuit 240 and transmitter circuit 250 with the appropriate configuration settings, state machine 330 may output signal CLK-CTRL 214, signal RECONFIG-CTRL 216, and signal RESET-CTRL 218 to configuration circuitry 220. In the embodiment of FIG. 3, reconfiguration circuitry 220 may include PLL reconfiguration circuit 340, transceiver reconfiguration circuit 350, and transceiver reset control circuit 360. Based on CLK-CTRL signal 216, PLL reconfiguration circuit 340 may output CLK-RECONFIG signal 222 to clock generation circuitry 230. In the embodiment of FIG. 3, clock generation circuitry 230 includes PLL circuit 370. Accordingly, CLK-RECONFIG signal 222 may include configuration settings to reconfigure PLL circuit 370.

As shown in FIG. 3, after reconfiguration, PLL circuit 370 may generate signal TRANS-CLK 232 as a clock signal for receiver circuit 240 and transmitter circuit 250. Transceiver reconfiguration circuit 350 outputs signal TRANS-RECONFIG 243 that may include configuration settings to reconfigure receiver circuit 240 and transmitter circuit 250. As an example, both receiver circuit 240 and transmitter circuit 250 may be configured concurrently. This is merely illustrative and, if desired, circuits 240 and 250 may be configured sequentially.

In order to control the reconfiguration operation of receiver circuit 240 and transmitter circuit 250, transceiver reset control circuit 360 may output RESET signal 245 based on signal RESET-CTRL 218 received from state machine 330. After reconfiguration (if needed) of receiver circuit 240 and transmitter circuit 250, receiver circuit 240 may receive the data stream DATA-IN 241 that may have a corresponding arbitrary data rate.

Depending on the data rate of data stream DATA-IN 241, if oversampling is needed (e.g., when OVERSAMPLE flag 212 is asserted), receiver circuit 240 (or intervening circuit/protocol blocks between receiver circuit 240 and transmitter circuit 250 that are not shown in FIG. 3) may oversample data stream DATA-IN 241. Transmitter circuit 250 may accordingly output data stream DATA-OUT 252. In one embodiment, data stream DATA-OUT 252 may have the same data rate as received data stream DATA-IN 241 and may be transmitted to external circuitry that may be connected to transceiver circuitry 300.

Figure 4:
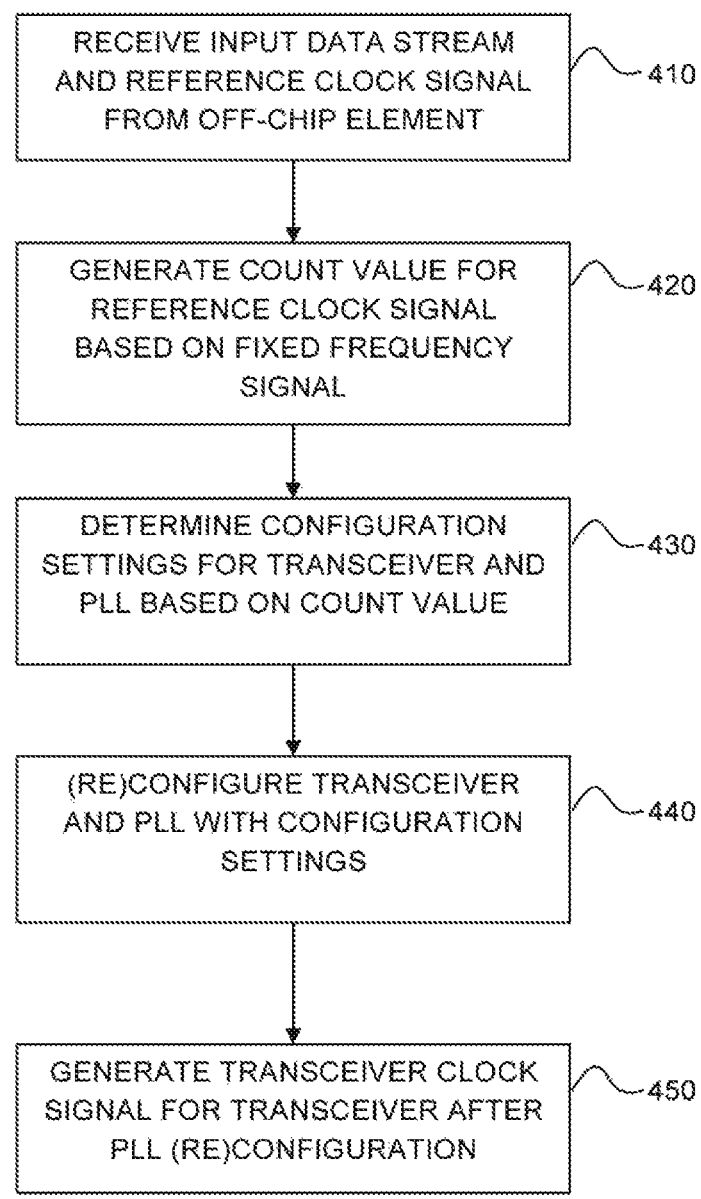
FIG. 4 shows illustrative method steps for operating transceiver circuitry in an integrated circuit in accordance with embodiments of the present invention.

FIG. 4 shows illustrative method steps for operating transceiver circuitry in an IC in accordance with embodiments of the present invention. As an example the transceiver circuitry that performs any or all of the steps shown in FIG. 4 may be transceiver circuitry 200 of FIG. 2. At step 410, the circuitry may receive an input data stream and a reference clock signal from an off-chip element. For example, transceiver circuitry 200 may receive HDMI signals from an external circuit element. The reference clock signal in this instance may be the TMDS clock signal that is part of the HDMI protocol.

At step 420, the circuitry may generate a count value for the reference clock signal based on a fixed frequency signal. Rate detection circuitry 210 of FIG. 2 may compare signal REF-CLK 231 with a fixed frequency signal FIXED-FREQ to generate a final count value. At step 430, configuration settings for the transceiver circuitry and a PLL circuit (or a clock generation circuit) may be determined based on the final count value. As explained above with reference to FIG. 3, comparator circuit 320 in rate detection circuitry 210 may determine the frequency range and settings for receiver circuit 240, transmitter circuit 250, and PLL circuit 370 based on the final count value. The final count value may be compared with respect to a predefined count threshold stored in the respective LUTs 325 of the comparator circuits 320. Encoded values for the different configuration settings may be obtained from the respective LUTs based on the final count value.

At step 440, the transceiver circuitry and PLL circuit is configured with the configuration settings. As shown in FIG. 3, receiver circuit 240, transmitter circuit 250, and PLL circuit 370 are configured or reconfigured with new configuration settings whenever transceiver circuitry 300 receives a data stream DATA-IN 241 with a different data rate. After PLL reconfiguration, the PLL circuit may generate a transceiver clock signal for the transceiver circuitry at step 450. As shown in FIG. 3, PLL circuit 370 generates signal TRANS-CLK for both receiver circuit 240 and transmitter circuit 250.

Figure 5:
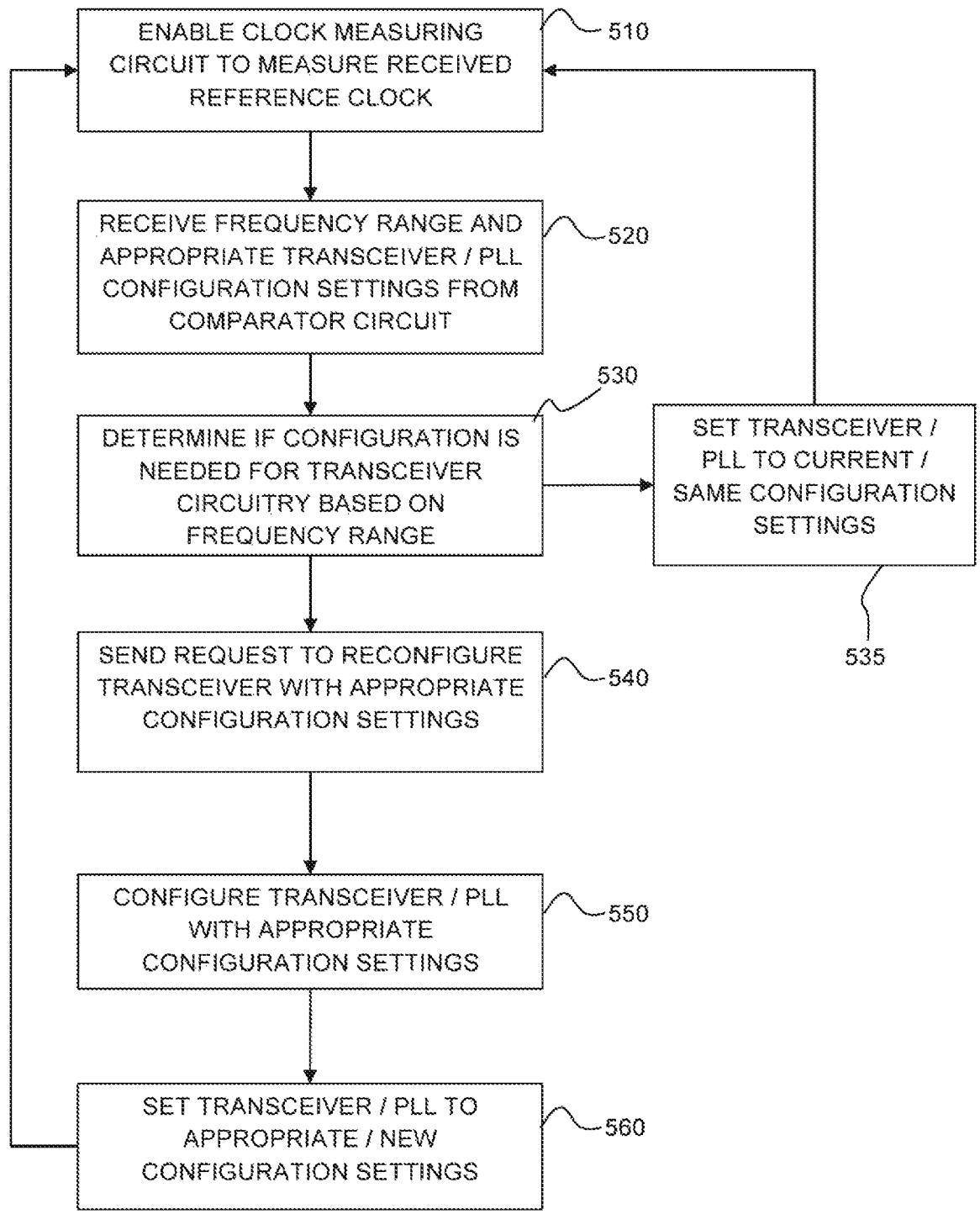
FIG. 5 shows illustrative method steps performed by a state machine in accordance with embodiments of the present invention.

FIG. 5 shows illustrative method steps performed by a state machine in accordance with embodiments of the present invention. The steps shown in FIG. 5 may be explained with reference to transceiver circuitry 300 of FIG. 3, for example.

At step 510, state machine 330 may enable clock measuring circuit 310 to measure a received reference clock signal REF-CLK 231. As an example, state machine 330 may transmit an asserted enable signal EN 332 to enable clock measuring circuit 310. Clock measuring circuit 310 may generate a count value based on the received reference clock signal REF-CLK 231 and signal FIXED-FREQ 211. The generated count value may then be used by comparator circuit 320 to determine the appropriate frequency range and appropriate configuration settings for transceiver circuitry 300. At step 520, state machine 330 may receive the determined frequency range and appropriate transceiver and/or PLL configuration settings from comparator circuit 320.

At step 530, state machine 330 may determine whether transceiver circuitry 300 (or more specifically, receiver circuit 240, transmitter circuit 250, and PLL circuit 370) needs to be reconfigured based on the current frequency range and the frequency range received from comparator circuit 320 at step 520. If the current frequency is different than the frequency of the received reference clock signal, state machine 330 sends a request to reconfigure transceiver circuitry 300 at step 540. As shown in FIG. 3, state machine 330 may send various control signals such as CLK-CTRL 214, RECONFIG-CTRL 216, and RESET-CTRL 218 to configuration circuitry 220 so that configuration circuitry 220 may send appropriate configuration and control signals to configure PLL circuit 370, receiver circuit 240, and/or transmitter circuit 250 as needed.

At step 550, reconfiguration controller circuits within configuration circuitry 220 such as PLL reconfiguration circuit 230, and transceiver reconfiguration circuit 350 may reconfigure PLL circuit 370, and receiver circuit 240 and transmitter circuit 250, respectively. In some general, PLL circuit 370, receiver circuit 240, and/or transmitter circuit 250 may be reconfigured simultaneously or concurrently.

At step 560, transceiver circuitry 300 (or more specifically, receiver circuit 240, transmitter circuit 250, and PLL circuit 370) may be set to the new configuration settings. As shown in FIG. 3, transceiver reset control circuit 360 outputs a RESET signal 245 to control both receiver circuit 240 and transmitter circuit 250.

In this instance, RESET signal 245 may be a control signal that enables receiver circuit 240 and transmitter circuit 250 to be set to the appropriate configuration settings received from transceiver reconfiguration circuit 350. Once transceiver circuitry 300 has been set or reconfigured to its desired data rate or operating frequency, state machine 330 may re-enable clock measuring circuitry 310 so that clock measuring circuitry 310 may monitor the received clock frequency to detect any frequency changes that may require transceiver circuitry to be reconfigured.

Or, if at step 530 state machine 330 determines that there is no change in the frequency of the received reference clock signal and that the transceiver circuitry does not need to be reconfigured, transceiver circuitry 300 may be set to the current (or same) configuration settings at step 535. State machine 330 may accordingly re-enable clock measuring circuitry 310 to continue monitoring the received signal to detect any frequency changes.

It is noted that even the embodiments described above have been described with respect to programmable logic circuits, the methods and apparatus described herein may be advantageously incorporated into any suitable integrated circuit. For example, these method and apparatus may also be incorporated into numerous types of devices such as microprocessors or other integrated circuits. Other examples of such integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; input-output circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method, comprising:
    receiving a first reference clock signal at receiving circuitry, having a first frequency from external circuitry that is external to the receiving circuitry;
    receiving a second reference clock signal at the receiving circuitry, having a second frequency from the external circuitry, wherein the second frequency is different from the first frequency;
    determining a change in frequency a between the first frequency of the first reference clock signal and the second frequency of the second reference clock signal; and
    in response to determining the change in frequency;
        reconfiguring phase-locked loop (PLL) circuitry to generate a receiver clock signal for the receiving circuitry to match the second frequency; and
        reconfiguring the receiving circuitry based at least in part on the receiver clock signal.

2. The method of claim 1, wherein reconfiguring the receiving circuitry comprises:
    reconfiguring the receiving circuitry from a first configuration to a second configuration; and
    after reconfiguring the receiving, circuitry resetting the receiving circuitry.

3. The method of claim 1, comprising receiving, using the receiving circuitry, a data stream associated with the second reference clock signal.

4. The method of claim 3, wherein the data stream comprises a High Definition Multimedia Interface (HDMI) signal.

5. The method of claim 1, comprising, in response to detecting the change in frequency, reconfiguring transmitting circuitry based at least in part on the receiver clock signal.

6. The method of claim 5, comprising sequentially reconfiguring the transmitting circuitry and the receiving circuitry.

7. The method of claim 5, comprising concurrently reconfiguring the transmitting circuitry and the receiving circuitry.

8. A circuitry comprising:
    receiving circuitry configured to receive:
        a first reference clock signal having a first frequency from external circuitry that is external to the circuitry; and
        a second reference clock signal having a second frequency from the external circuitry, wherein the second frequency is different from the first frequency;
    detector circuitry configured to detect a change in frequency between the first frequency of the first reference clock signal and the second frequency of the second reference clock signal; and
    control circuitry configured to, in response to the detector circuitry detecting the change in frequency:
        reconfigure phase-locked loop circuitry configured to generate a receiver clock signal having the second frequency; and
        reconfigure the receiving circuitry operating at the first frequency to operate based at least in part on the receiver clock signal having the second frequency.

9. The circuitry of claim 8, wherein the second reference clock signal is associated with a data stream, wherein the receiving circuitry is configured to receive the data stream.

10. The circuitry of claim 9, wherein the data stream comprises video data.

11. The circuitry of claim 9, wherein the data stream comprises a High Definition Multimedia Interface (HDMI) signal.

12. The circuitry of claim 8, wherein the circuitry comprises an HDMI interface.

13. The circuitry of claim 8, wherein the detector circuitry is configured to receive a single transition multimedia differential signaling (TMDS) clock signal as the second reference clock signal.

14. The circuitry of claim 8, wherein the control circuitry is configured to, in response to the detector circuitry detecting the change in frequency:
    generate a reconfiguration signal to reconfigure the receiving circuitry;
    transmit the reconfiguration signal to the receiving circuitry;
    generate a reset signal to reset the receiving circuitry; and
    transmit the reset signal to the receiving circuitry.

15. The circuitry of claim 8, wherein the circuitry is communicatively coupled to a transceiver, wherein the transceiver comprises the receiving circuitry.

16. The circuitry of claim 8, wherein the control circuitry is configured to, in response to detecting the change in frequency, reconfigure transmitting circuitry to operate based at least in part on the receiver clock signal.

17. A circuitry comprising:
    receiving circuitry configured to receive:
        a first reference clock signal having a first frequency from external circuitry that is external to the circuitry; and
        a second reference clock signal having a second frequency from the external circuitry, wherein the second frequency is different from the first frequency;
    detector circuitry configured to receive the first reference clock signal and the second reference clock signal from the external circuitry and detect a change in frequency between the first frequency of the first reference clock signal and the second frequency of the second reference clock signal; and
    control circuitry configured to, in response to the detector circuitry detecting the change in the frequency:
        reconfigure clock generating circuitry configured to generate a transmitter clock signal based at least in part on the change in frequency; and
        reconfigure transmitting circuitry based at least in part on the transmitter clock signal.

18. The circuitry of claim 17, wherein the clock generating circuitry comprises phase-locked loop (PLL) circuitry.

19. The circuitry of claim 17, wherein, in response to reconfiguring the transmitting transmitter circuitry to operate based at least in part on the transmitter clock signal, the transmitting circuitry is configured to transmit an output signal based at least in part on the transmitter clock signal.

20. The circuitry of claim 17, wherein a field-programmable gate array comprises the circuitry.

* * * * *